United States Patent
Kawano et al.

(10) Patent No.: US 10,707,263 B2
(45) Date of Patent: Jul. 7, 2020

(54) METHOD OF MANUFACTURING SOLID-STATE IMAGE SENSOR

(71) Applicant: SHARP KABUSHIKI KAISHA, Sakai, Osaka (JP)

(72) Inventors: Hiroyuki Kawano, Sakai (JP); Tomoaki Arakawa, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 16/440,054

(22) Filed: Jun. 13, 2019

(65) Prior Publication Data
US 2019/0386058 A1   Dec. 19, 2019

Related U.S. Application Data

(60) Provisional application No. 62/685,491, filed on Jun. 15, 2018.

(51) Int. Cl.
| | |
|---|---|
| *H01L 27/146* | (2006.01) |
| *G03F 7/32* | (2006.01) |
| *G03F 7/16* | (2006.01) |
| *G03F 7/20* | (2006.01) |
| *G03F 7/38* | (2006.01) |

(52) U.S. Cl.
CPC ......... *H01L 27/14685* (2013.01); *G03F 7/16* (2013.01); *G03F 7/20* (2013.01); *G03F 7/322* (2013.01); *G03F 7/38* (2013.01); *H01L 27/14621* (2013.01); *H01L 27/14625* (2013.01); *H01L 27/14627* (2013.01); *H01L 27/14636* (2013.01); *H01L 27/14645* (2013.01); *H01L 27/14689* (2013.01)

(58) Field of Classification Search
CPC ......... H01L 27/14685; H01L 27/14623; H01L 27/14625; H01L 27/1463; H01L 31/02327
See application file for complete search history.

(56) References Cited

U.S. PATENT DOCUMENTS

| | | | | |
|---|---|---|---|---|
| 8,610,228 B2* | 12/2013 | Saitou | ............ | G02B 3/0056 |
| | | | | 257/432 |
| 9,165,962 B2* | 10/2015 | Tanida | ............ | H01L 27/14623 |
| 2006/0220073 A1* | 10/2006 | Kooriyama | ......... | H01L 27/1462 |
| | | | | 257/257 |
| 2009/0250779 A1* | 10/2009 | Hirose | ............ | H01L 27/14621 |
| | | | | 257/432 |
| 2011/0094600 A1 | 4/2011 | Bergeron et al. | | |
| 2011/0309460 A1* | 12/2011 | Tsuji | ............ | H01L 27/14621 |
| | | | | 257/432 |
| 2015/0194460 A1* | 7/2015 | Maekawa | ......... | H01L 27/14685 |
| | | | | 438/70 |

FOREIGN PATENT DOCUMENTS

| | | |
|---|---|---|
| JP | 2012-004368 A | 1/2012 |
| JP | 2015-144298 A | 8/2015 |

* cited by examiner

*Primary Examiner* — Jaehwan Oh
(74) *Attorney, Agent, or Firm* — ScienBiziP, P.C.

(57) ABSTRACT

The thickness of an embedding film in a pixel region is adjusted without adding a step.

A method of manufacturing a solid-state image sensor (100) according to an embodiment of the present invention includes a development step of removing a photosensitive material (M) in a peripheral circuit region (30) and reducing and adjusting the thickness of the photosensitive material (M) that is in a pixel region (20) and on a multilayered wiring layer (5) to a desired film thickness.

6 Claims, 3 Drawing Sheets

1: SEMICONDUCTOR SUBSTRATE
3: PHOTOELECTRIC CONVERTER
5: MULTILAYERED WIRING LAYER
5a: UPPER SURFACE
7: OPTICAL WAVEGUIDE
9: EMBEDDING LAYER
11: COLOR FILTER
13: MICROLENS
20: PIXEL REGION
30: PERIPHERAL CIRCUIT REGION
51: INTERLAYER INSULATING FILM
52: WIRING
53: OPENING
100: SOLID-STATE IMAGE SENSOR
M: PHOTOSENSITIVE MATERIAL
T1: FILM THICKNESS

1: SEMICONDUCTOR SUBSTRATE
3: PHOTOELECTRIC CONVERTER
5: MULTILAYERED WIRING LAYER
5a: UPPER SURFACE
7: OPTICAL WAVEGUIDE
9: EMBEDDING LAYER
11: COLOR FILTER
13: MICROLENS
20: PIXEL REGION
30: PERIPHERAL CIRCUIT REGION
51: INTERLAYER INSULATING FILM
52: WIRING
53: OPENING
100: SOLID-STATE IMAGE SENSOR
M: PHOTOSENSITIVE MATERIAL
T1: FILM THICKNESS

1: SEMICONDUCTOR SUBSTRATE
3: PHOTOELECTRIC CONVERTER
5: MULTILAYERED WIRING LAYER
5a: UPPER SURFACE
7: OPTICAL WAVEGUIDE
9: EMBEDDING LAYER
11: COLOR FILTER
13: MICROLENS
20: PIXEL REGION
30: PERIPHERAL CIRCUIT REGION
51: INTERLAYER INSULATING FILM
52: WIRING
53: OPENING
101: SOLID-STATE IMAGE SENSOR
M: PHOTOSENSITIVE MATERIAL
T2: FILM THICKNESS

METHOD OF MANUFACTURING SOLID-STATE IMAGE SENSOR

TECHNICAL FIELD

The present invention relates to a method of manufacturing a sold-state image sensor, and in particular to a method of manufacturing a solid-state image sensor including an optical waveguide.

BACKGROUND ART

In recent years, solid-state image sensors including an optical waveguide for increasing the amount of light that enters a photoelectric converter have been proposed. For example, PTL 1 discloses a method of manufacturing a solid-state image sensor having a groove, from which a part of a photosensitive material (waveguide material) forming as optical waveguide is removed, in a pixel region. PTL 2 discloses a method of manufacturing a solid-state image sensor including a step of flattening a photosensitive material in a pixel region by CMP (Chemical Mechanical Polishing) or the like.

CITATION LIST

Patent Literature

PTL 1: Japanese Unexamined Patent Application Publication No. 2012-4368
PTL 2: Japanese Unexamined Patent Application Publication No. 2015-144298

SUMMARY OF INVENTION

Technical Problem

In order to embed a photosensitive material in an optical waveguide, usually, it is necessary to apply the photosensitive material so as to have a film thickness that is about ½ to ¼ of the opening diameter of the optical waveguide. Therefore, with the manufacturing method described in PTL 1, the film thickness of an embedding film of the photosensitive material formed on an interlayer insulating film in the pixel region becomes large. Thus, a color filter and microlenses disposed on the embedding film become distant from the optical waveguide, and the method has a problem in that leakage of light to an adjacent pixel increases. With the manufacturing method described in PTL 2, it is necessary to add a step of adjusting the film thickness of the embedding film by CMP or the like. Therefore, the method is disadvantageous in manufacturing cost and yield.

An object of an aspect of the present invention is to provide a method of manufacturing a solid-state image sensor that can adjust the thickness of an embedding film in a pixel region without adding a step.

Solution to Problem (1) A method of manufacturing a solid-state image sensor according to an aspect of the present invention is a method of manufacturing a solid-state image sensor that includes a pixel region. and a peripheral circuit region in which a circuit for processing a signal from the pixel region is disposed, an optical waveguide being formed in the pixel region. The method includes an application step of applying a photosensitive material to a multilayered wiring layer that is formed over the pixel region and the peripheral circuit region and that has an opening for forming the optical waveguide; an exposure step of exposing a part of the photosensitive material to light; and a development step of removing the photosensitive material in the peripheral circuit region and reducing and adjusting a thickness of the photosensitive material that is in the pixel region and on the multilayered wiring layer to a desired film thickness.

(2) In a method of manufacturing a solid-state image sensor according to an aspect of the present invention, in addition to (1) described above, in the development step, the thickness of the photosensitive material on the multilayered wiring layer in the pixel region is reduced to ⅓ or smaller.

(3) A method of manufacturing a solid-state image sensor according to an aspect of the present invention further includes, in addition to (1) or (2) described above, a hydrophilization step of hydrophilizing the photosensitive material between the application step and the development step.

(4) A method of manufacturing a solid-state image sensor according to an aspect of the present invention further includes, in addition to (3) described above, a water-washing step of water-washing the photosensitive material between the hydrophilization step and the development step.

(5) A method of manufacturing a solid-state image sensor according to an aspect of the present invention further includes, in addition to (1) or (2) described above, a water-washing step of water-washing the photosensitive material applied to the multilayered wiring layer between the exposure step and the development step.

(6) In a method of manufacturing a solid-state image sensor according to an aspect of the present invention, in addition to (1) to (5) described above, the development step is a step of immersing the photosensitive material in a developing liquid; and, in the development step, by controlling a time for which the photosensitive material is immersed in the developing liquid, the thickness of the photosensitive material on the multilayered wiring layer is reduced and adjusted to the desired film thickness.

Advantageous Effects of Invention

With an aspect of the present invention, it is possible to provide a method of manufacturing a solid-state image sensor that can adjust the thickness of an embedding film in a pixel region without adding a step.

DESCRIPTION OF EMBODIMENTS

Hereafter, an embodiment of the present invention will be described in detail with reference to FIGS. 1 to 3.

(Structure of Solid-State Image Sensor)

Figure 1:
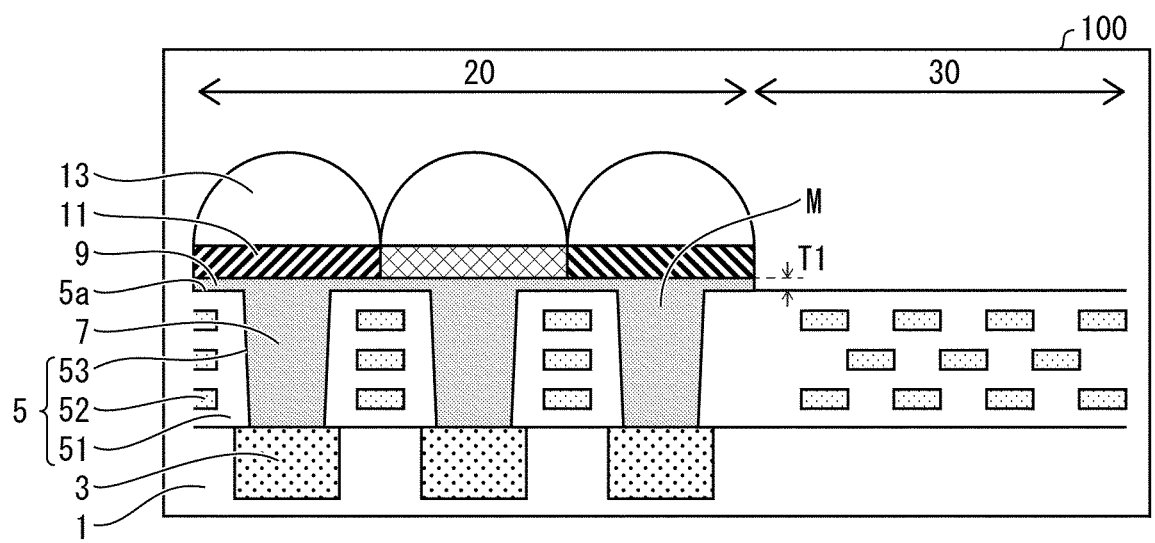
FIG. 1 is a sectional view illustrating a solid-state image sensor according to an embodiment of the present invention.

Referring to FIG. 1, the structure of a solid-state image sensor according to an embodiment of the present invention will be described. FIG. 1 is a sectional view illustrating a solid-state image sensor 100 according to an embodiment of the present invention. The solid-state image sensor 100 is, for example, a CMOS (Complementary Metal Oxide Semiconductor) image sensor. The solid-state image sensor 100 includes a semiconductor substrate 1, photoelectric converters 3, a multilayered wiring layer 5, optical waveguides 7, an embedding film 9, a color filter 11, and microlenses 13.

The solid-state image sensor 100 includes a pixel region 20 in which the plurality of photoelectric converters 3 are disposed and a peripheral circuit region 30 in which a circuit for processing a signal from the pixel region 20 is disposed. In the pixel region 20, the photoelectric converters 3, the optical waveguides 7 formed in openings (through-holes) 53 of the multilayered wiring layer 5, the embedding film 9, the color filter 11, and the microlenses 13 are disposed.

The plurality of photoelectric converters 3 are formed in the semiconductor substrate 1, which is made of silicon or the like, in the pixel region 20. The optical waveguides 7, which serve as light propagation paths, are respectively disposed on the photoelectric converters 3.

The multilayered wiring layer 5 is formed on the semiconductor substrate 1 and includes an interlayer insulating film 51 and wiring 52. The interlayer insulating film 51 is an oxide film or the like that is formed by performing a plasma CVD (Chemical Vapor Deposition) step or the like. The material of the interlayer insulating film 51 is appropriately selected in accordance with the material of the wiring 52. The wiring 52 is made of a conductive material. The wiring 52 includes multiple layers, and the interlayer insulating film 51 is present between the layers of the wiring 52. Thus, the layers of the wiring 52 are insulated from each other. Examples of the wiring 52 include Al (aluminum) wiring and Cu (copper) wiring. Examples of the material of the interlayer insulating film 51 that is suitable for Al wiring include a silicon oxide film. Examples of the material of the interlayer insulating film 51 that is suitable for Cu wiring include a silicon oxide film and a silicon carbide film.

The multilayered wiring layer 5 has the openings 53 for forming the optical waveguides 7. The plurality of openings 53 are formed so as to correspond to the photoelectric converters 3. The openings 53 are formed by using a photolithography step, a dry etching step, and the like.

The optical waveguides 7 and the embedding film 9 are each made of a photosensitive material (waveguide material) M. The optical waveguides 7 are formed by embedding the photosensitive material M in the openings 53. The embedding film 9 is formed of the photosensitive material M that is not embedded in the openings 53 and is disposed on the openings 53 and on the multilayered wiring layer 5. Examples of the photosensitive material M include a polyimide resin and a polysiloxane. Either of a negative-type photosensitive agent and a positive-type photosensitive agent may be used.

The color filter 11 is disposed on the embedding film 9 so as to correspond to the photoelectric converters 3. The colors of the color filter may be changed from pixel to pixel depending on the use. The microlenses 13 are formed on the color filter 11. The color filter 11 and the microlenses 13 are each made by performing a photolithography step and the like.

The solid-state image sensor 100 disperses incident light collected by the microlenses 13 by using the color filter 11. The dispersed incident light passes through the embedding film 9 and the optical waveguides 7 and enters the photoelectric converters 3.

In a case where the thickness of the embedding film 9 is large, the color filter 11 and the microlenses 13, which are disposed on the embedding film 9, are distant from the optical waveguide 7, and leakage of light to an adjacent pixel increases. Therefore, in order to suppress the leakage of light, methods for reducing the thickness of the embedding film 9 by CMP or the like have been proposed. However, the existing methods are disadvantageous in manufacturing cost and yield, because it is necessary to separately add a step of reducing the thickness of the embedding film. A method of manufacturing the solid-state image sensor 100 according to the present embodiment realizes adjustment of the thickness of the embedding film 9 without adding a step.

(Method of Manufacturing Solid-State Image Sensor)

Figure 2:
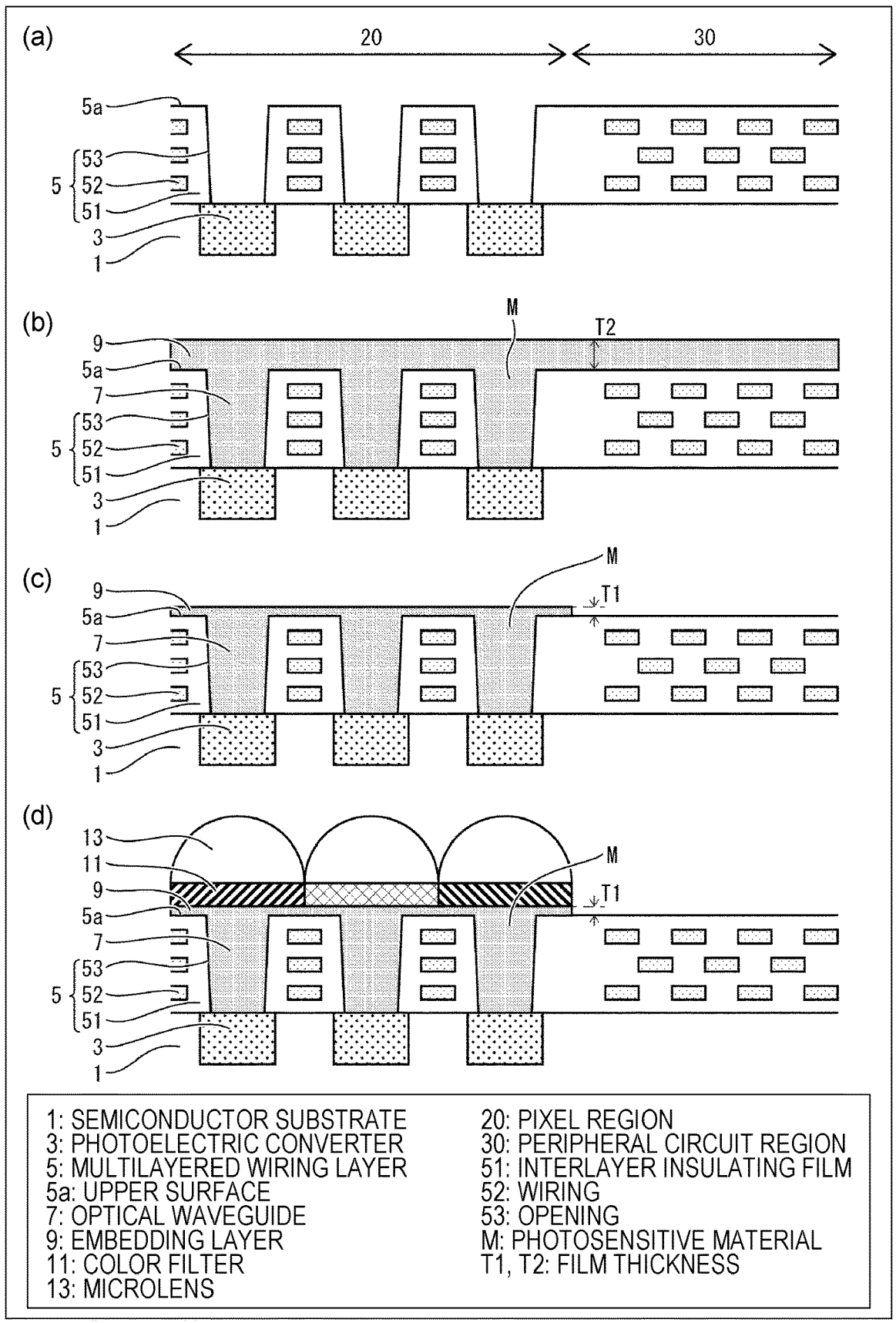
FIG. 2 is a sectional view illustrating the flow of a process of manufacturing the solid-state image sensor.

Referring to FIG. 2, the method of manufacturing the solid-state image sensor 100 according to the present embodiment will be described. The steps of the method of manufacturing a solid-state image sensor described below can be performed by using general solid-state image sensor manufacturing equipment.

FIGS. 2(a) to 2(d) are sectional views illustrating the flow of a process of manufacturing the solid-state image sensor 100. As illustrated in FIG. 2(a), first, the plurality of photoelectric converters 3 are formed in the pixel region 20 of the semiconductor substrate 1. The photoelectric converters 3 can be formed by repeatedly performing a photolithography step and an ion implantation step. Although gate electrodes and the like for driving pixels and a peripheral circuit are also formed in the semiconductor substrate 1, descriptions of these will be omitted.

Next, the interlayer insulating film 51 is formed on the semiconductor substrate 1 by performing a CVD step, a CMP step, and the like. Subsequently, the wiring 52 is formed by performing a sputtering step, a photolithography step, a dry etching step, and the like. By performing the steps of forming the interlayer insulating film 51 and the wiring 52 a plurality of times, the multilayered wiring layer 5, which includes multiple layers of the wiring 52, is formed. In a case where the wiring 52 is Al wiring, the wiring 52 is formed by performing a photolithography step, a dry etching step, and the like. In a case where the wiring 52 is Cu wiring, the wiring 52 having a groove embedded wiring structure is formed by performing, for example, a photolithography step, a CVD step, a CMP step, and the like. Although contact holes and the like, which electrically connect the semiconductor substrate 1 and the wiring 52 to each other, are also formed in the multilayered wiring layer 5, descriptions of these will be omitted.

Next, the openings 53 are formed at positions corresponding to the photoelectric converters 3 by performing a photolithography step, a dry etching step, and the like. At this time, by removing the interlayer insulating film 51 in tapered shapes, the effectiveness of the optical waveguides 7 can be increased. Although a stopper film and the like, which are used when forming the openings 53 by performing a dry etching step and the like, are also formed on the semiconductor substrate 1, descriptions of these will be omitted. After forming the openings 53, by forming a SiN film or the like as a passivation film by performing a CVD step and the like and by performing a sintering process and the like, dangling bonds of the gate electrodes and the like can be terminated.

Next, as illustrated in FIG. 2(b), the photosensitive material M is applied from an upper surface 5a side of the multilayered wiring layer 5 (application step). The optical waveguides 7 are formed from the photosensitive material M embedded in the openings 53. The embedding film 9 is formed from the photosensitive material M that is not embedded in the openings 53 and that is on the multilayered wiring layer 5 (in other words, on the openings 53 and on the upper surface 5a).

The photosensitive material M can be produced by adding a photosensitive agent to an organic material (such as a polyimide resin or a polysiloxane) including titanium oxide and having a high refractive index. Either of a positive-type photosensitive agent and a negative-type photosensitive agent may be used.

In the application step, in order to avoid generation of a void in the optical waveguides 7, preferably, the photosensitive material M is applied in consideration of the material viscosity and the application rotation speed. For example, in a case where the opening width of each of the openings 53 is 3.5 µm, the photosensitive material M is appropriately applied with a viscosity of 6 mPa·s and an application rotation speed of 500 rpm. Under this application conditions, the film thickness T2 of the embedding film 9 is about 1200 nm. This is about ⅓ of the opening width of each of the openings 53 at the upper surface 5a of the multilayered wiring layer 5.

Next, the photosensitive material M (the embedding film 9) is exposed to light (irradiated with light) (application step). In a case where the photosensitive material M is of a positive type, the peripheral circuit region 30 is irradiated with light in the exposure step. Thus, in the subsequent development step, the photosensitive material M that is in the peripheral circuit region 30, which has been exposed to light, is removed. In a case where the photosensitive material M is of a negative type, the pixel region 20 is irradiated with light in the exposure step. Thus, is the subsequent development step, the photosensitive material M that is in the peripheral circuit region 30, which has not been exposed to light, is removed.

Next, as illustrated in FIG. 2(c), the embedding film 9 in the peripheral circuit region 30 is removed, and the thickness of the embedding film 9 in the pixel region. 20 is adjusted (development step). The development step is performed, for example, by immersing the embedding film 9 in a developing liquid including an additive. By removing the embedding film 9 from the peripheral circuit region 30 in the development step, pad openings for wire bonding can be easily formed after forming the mcrolenses 13. The embedding film 9 (the photosensitive material M) in the peripheral circuit region 30 may remain to such an extent that the operation of forming pad openings is not obstructed, and it is not necessary to completely remove the embedding film 9.

In the development step, the thickness of the embedding film 9 in the pixel region 20 is reduced and adjusted to a desired film thickness T1. In a case where the photosensitive material M is of a positive type, by immersing the embedding film 9 in the pixel region 20 that has not been exposed to light in the exposure step in a developing liquid in the development step, it is possible to reduce the thickness of the embedding film 9 in the pixel region 20. In a case where the photosensitive material M of a negative type, by immersing the embedding film 9 that has been exposed to light in the developing liquid in the exposure step, it is possible to reduce the thickness of the embedding film 9 in the pixel region 20.

For example, the thickness of the embedding film 9 in the pixel region 20 decreases substantially in proportion to the time for which the embedding film 9 is immersed in the developing liquid. Therefore, by appropriately controlling the development-liquid-immersion time in the development step, it is possible to adjust the film thickness T1 of the embedding film 9 in the pixel region 20. In order to adjust the thickness of the embedding film 9, the developing liquid concentration, an additive, and the development method may be appropriately selected. An example of the developing liquid may be TMAH (Tetramethylammonium hydroxide), and an example of the additive may be a surfactant. As a surfactant, for example, any one of a nonionic surfactant, a cationic surfactant, an anionic surfactant, an amphoteric surfactant may be added; or a combination of two or more of these may be added. Moreover, in order to select developing conditions corresponding to an appropriate thickness of the embedding film 9, any one of the factors including the developing-liquid immersion time, the developing-liquid concentration, the presence or absence of an additive, the concentration of the additive may be changed; or more than one of these factors may be changed.

As a specific example of the developing conditions, for example, an TMAH aqueous solution with a TMAH concentration of 1.8 mass % is used as the developing liquid, a surfactant is added to the developing liquid as an additive, and the developing-liquid immersion time using a paddle method is 80 seconds. Under these developing conditions, the thickness of the embedding film 9 in the pixel region 20 can be reduced from about 1200 nm (film thickness T2) before the development step to about 300 nm (film thickness T1). Thus, the thickness of the embedding film 9 in the pixel region 20 can be adjusted to ¼ or smaller.

Preferably, the film thickness T1 of the embedding film 9 in the pixel region 20 after the development step is adjusted to ⅓ or smaller of the film thickness T2 of the embedding film 9 before the development step, and more preferably, is adjusted to 1/10 or smaller of the film thickness T2. In this case, the light-collection efficiency of the solid-state image sensor 100 can be appropriately improved.

Next, as illustrated in FIG. 2(d), the color filter 11 and the microlenses 13 are successively formed on the embedding film 9. These are formed from a photosensitive color filter material and a microlens material by performing a photolithography step and the like. A flattening layer may be formed on the embedding film 9 or on the color filter 11. An antireflection film may be formed on the microlenses 13.

Moreover, although not illustrated, pad openings for wire bonding, which are to be disposed in the peripheral circuit region 30, are subsequently formed by performing a photolithography step, dry etching step, and the like. Because the embedding film 9, the color filter 11, and the microlenses 13 do not remain in the peripheral circuit region 30, the pad openings for wire bonding can be easily formed.

Advantageous Effects

As described above, the method of manufacturing the solid-state image sensor 100 according to the present embodiment is the method of manufacturing the solid-state image sensor 100 that includes the pixel region 20 and the peripheral circuit region 30 in which a circuit for processing a signal from the pixel region 20 is disposed, the optical waveguide 7 being formed in the pixel region 20. The method includes an application step of applying the photosensitive material M to the multilayered wiring layer 5 that is formed over the pixel region 20 and the peripheral circuit region 30 and that has an opening for forming the optical waveguide 7; an exposure step of exposing a part of the photosensitive material M to light; and a development step of removing the photosensitive material M in the peripheral circuit region 30 and reducing and adjusting the thickness of the photosensitive material M that is in the pixel region 20 and on the multilayered wiring layer 5 to the desired film thickness T1.

With the method of manufacturing the solid-state image sensor 100, in the development step, the photosensitive material M in the peripheral circuit region 30 is removed, and the thickness of the photosensitive material M (the embedding film 9) on the multilayered wiring layer 5 in the pixel region 20 is reduced and adjusted to a desired film thickness T1. Therefore, it is not necessary to separately add a step of reducing the thickness of the embedding film in the pixel region as in existing technologies, and manufacturing cost and yield can be improved.

That is, with the method of manufacturing the solid-state image sensor 100, by setting appropriate developing conditions, the thickness of the embedding film 9 in the pixel region 20 can be adjusted to the desired film thickness T1 in the development step. Advantageous effects of the present embodiment will be described with reference to FIGS. 1 and 3.

Figure 3:
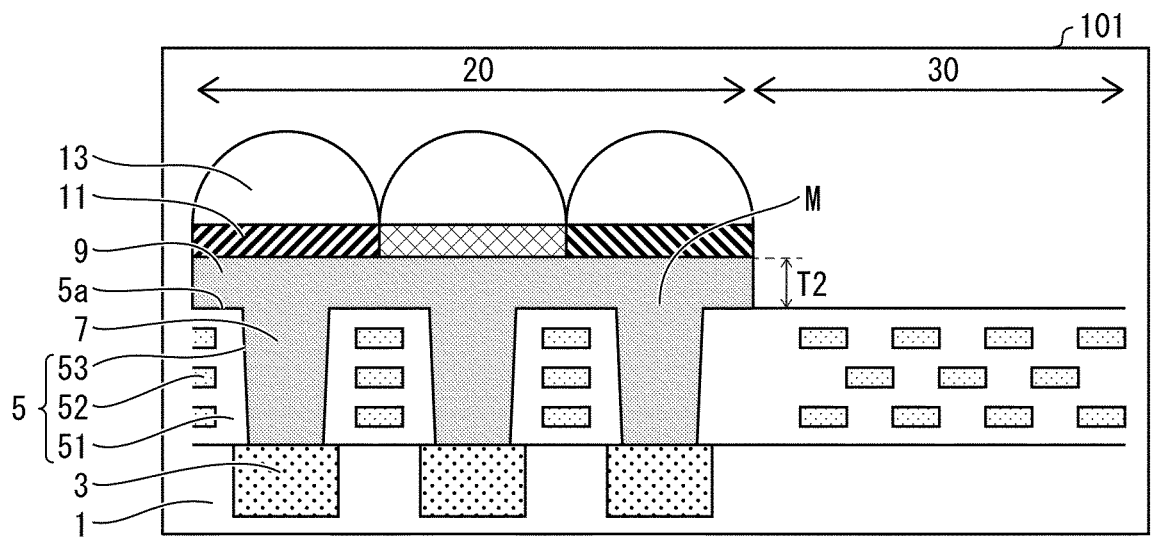
FIG. 3 is a sectional view illustrating a solid-state image sensor according to a comparative example.

FIG. 3 is a sectional view illustrating a solid-state image sensor 101 according to a comparative example in the development step. As illustrated in FIG. 3, in a case where an existing development step is used, the embedding film 9 in the pixel region 20 continues to have a thickness that is substantially the same as the film thickness T2 at the time of the application step. Therefore, in the solid-state image sensor 101, the color filter 11 and the microlenses 13 are distant from the optical waveguides 7, and the solid-state image sensor 101 has a problem in that leakage of light to an adjacent pixel increases. In contrast, in a case where the development step according to the present embodiment is used, as illustrated in FIG. 1, the embedding film 9 is formed to have the film thickness T1, which is smaller than the film thickness T2. Therefore, with the solid-state image sensor 100, the aforementioned leakage of light is suppressed, and light collection efficiency is improved.

(Modifications)

A method of manufacturing the solid-state image sensor 100 according to the present embodiment may further include a hydrophilization step of hydrophilizing the embedding film 9 (the photosensitive material M) between the application step and the development step.

If the film thickness is unevenly reduced in the development step, variation in the thickness of the embedding film 9 in the pixel region 20 may occur. The variation may generate light-collection difference between elements, and may cause unevenness in image. By adding a hydrophilization step of hydrophilizing the embedding film 9 before the development step, it is possible to form the embedding film 9 so as to have an even thickness.

As the hydrophilzation step, for example, hydrophilization can be performed appropriately by irradiating the surface of the embedding film 9 with oxygen plasma for 10 seconds by using a plasma device. By successively performing the development step, the thickness of the embedding film 9 is reduced evenly, and the embedding film 9 having a small thickness variation is formed. The hydrophilization step may be performed before the exposure step or may be performed before the development step.

The method of manufacturing the solid-state image sensor 100 according to the present embodiment may further include a water-washing step of water-washing the embedding film 9 (the photosensitive material M) between the hydrophilization step and the development step. By performing the water-washing step, the thickness of the embedding film 9 is reduced more evenly, and the embedding film 9 having a small thickness variation is formed. In the water-washing step, for example, by performing water-washing for 5 seconds in a developing device and performing the development step in a state in which water remains on the surface of the embedding film 9, uneven reduction of the thickness due to difference in development-liquid dripping environment on the surface of the embedding film 9 can be suppressed. As a result, the embedding film 9 having a small thickness variation is formed.

Only one of the water-washing step and the hydrophilization step may be performed, or both of these steps may be performed.

[Summary]

A method of manufacturing a solid-state image sensor according to a first aspect of the present invention is a method of manufacturing a solid-state image sensor that includes a pixel region and a peripheral circuit region in which a circuit for processing a signal from the pixel region is disposed, an optical waveguide being formed in the pixel region. The method includes an application step of applying a photosensitive material to a multilayered wiring layer that is formed over the pixel region and the peripheral circuit region and that has an opening for forming the optical waveguide; an exposure step of exposing a part of the photosensitive material to light; and a development step of removing the photosensitive material in the peripheral circuit region and reducing and adjusting a thickness of the photosensitive material that is in the pixel region and on the multilayered wiring layer to a desired film thickness.

With the method described above, in the development step, the photosensitive material in the peripheral circuit region is removed, and the thickness of the photosensitive material (the embedding film) on the multilayered wiring the pixel region is reduced and adjusted to a desired film thickness. Therefore, it is not necessary to separately add a step of reducing the thickness of the embedding film in the pixel region as in existing technologies, and manufacturing cost and yield can be improved.

Accordingly, with the method described above, it is possible to manufacture, without adding a step, a solid-state image sensor in which the thickness of the embedding film in the pixel region can be adjusted.

In a method of manufacturing a solid-state image sensor according to a second aspect of the present invention, in the first aspect, in the development step, the thickness of the photosensitive material on the multilayered wiring layer in the pixel region may be reduced to ⅓ or smaller.

With the method described above, it is possible to manufacture a solid-state image sensor having high light concentration efficiency by adjusting the thickness of the embedding film in the pixel region without adding a step.

A method of manufacturing a solid-state image sensor according to a third aspect of the present invention may further include, in the first and second aspects, a hydrophilization step of hydrophilizing the photosensitive material between the application step and the development step.

If the thickness of the photosensitive material (the embedding film) on the multilayered wiring layer in the pixel region has variation, light collection difference occurs and causes unevenness in image. With the method described above, by hydrophilizing the photosensitive material between the application step and the development step, is possible to form an embedding film having a small thickness variation in the pixel region in the development step. Accordingly, with the method described above, it is possible to manufacture a solid-state image sensor with which unevenness in image is suppressed.

A method of manufacturing the solid-state image sensor 100 according to a fourth aspect of the present invention may further include, in the third aspect, a water-washing step of water-washing the photosensitive material between the hydrophilization step and the development step.

With the method described above, by water-washing the photosensitive material between the hydrophilization step and the development step, it is possible to form an embedding film having a smaller thickness variation in the pixel region. Accordingly, with the method described above, it is possible to manufacture a solid-state image sensor with which unevenness in image is further suppressed.

A method of manufacturing the solid-state image sensor 100 according to a fifth aspect of the present invention may further include, in the first and second aspects, a water-washing step of water-washing the photosensitive material applied to the multilayered wiring layer between the exposure step and the development step.

If the thickness of the photosensitive material (the embedding film) on the multilayered wiring layer in the pixel region has variation, light collection difference occurs and causes unevenness in image. With the method described above, by water-washing the photosensitive material between the exposure step and the development step, it is possible to form an embedding film having a small thickness variation in the pixel region in the development step. Accordingly, with the method described above, it is possible to manufacture a solid-state image sensor with which unevenness in image is suppressed.

In a method of manufacturing a solid-state image sensor according to a sixth aspect of the present invention, in the first to fifth aspects, the development step may be a step of immersing the photosensitive material in a developing liquid; and, in the development step, by controlling a time for which the photosensitive material is immersed in the developing liquid, the thickness of the photosensitive material may be reduced and adjusted to the desired film thickness.

With the method described above, by controlling the developing-liquid immersion time in the development step, the thickness of the photosensitive material (the embedding film) on the multilayered wiring layer in the pixel region can be adjusted to a desired film thickness. Accordingly, with the method described above, the thickness of the embedding film can be adjusted to the desired film thickness by changing the developing-liquid immersion time in the development step.

The present invention is not limited to the embodiments described above and may be modified within the scope represented in the claims. The technical scope of the present invention includes embodiments that are obtained by appropriately combining technical features that are respectively disclosed in different embodiments. Moreover, a new technical feature may be formed by combining technical features that are respectively disclosed in the embodiments.

REFERENCE SIGNS LIST 1 semiconductor substrate
3 photoelectric converter
5 multilayered wiring layer
5a upper surface
7 optical waveguide
9 embedding film
11 color filter
13 microlens
20 pixel region
30 peripheral circuit region
51 interlayer insulating film
52 wiring
53 opening
100 solid-state image sensor
M photosensitive material
T1 film thickness
T2 film thickness

The invention claimed is:

1. A method of manufacturing a solid-state image sensor that includes a pixel region and a peripheral circuit region in which a circuit for processing a signal from the pixel region is disposed, an optical waveguide being formed in the pixel region, the method comprising:
   an application step of applying a photosensitive material to a multilayered wiring layer that is formed over the pixel region and the peripheral circuit region and that has an opening for forming the optical waveguide;
   an exposure step of exposing a part of the photosensitive material to light; and
   a development step of removing the photosensitive material in the peripheral circuit region and reducing and adjusting a thickness of the photosensitive material that is in the pixel region and on the multilayered wiring layer to a desired film thickness.

2. The method of manufacturing a solid-state image sensor according to claim 1, wherein, in the development step, the thickness of the photosensitive material on the multilayered wiring layer in the pixel region is reduced to ⅓ or smaller.

3. The method of manufacturing a solid-state image sensor according to claim 1, further comprising a hydrophilization step of hydrophilizing the photosensitive material between the application step and the development step.

4. The method of manufacturing a solid-state image sensor according to claim 3, further comprising a water-washing step of water-washing the photosensitive material between the hydrophilization step and the development step.

5. The method of manufacturing a solid-state image sensor according to claim 1, further comprising a water-washing step of water-washing the photosensitive material applied to the multilayered wiring layer between the exposure step and the development step.

6. The method of manufacturing a solid-state image sensor according to claim 1,
   wherein the development step is a step of immersing the photosensitive material in a developing liquid, and
   wherein, in the development step, by controlling a time for which the photosensitive material is immersed in the developing liquid, the thickness of the photosensitive material on the multilayered wiring layer is reduced and adjusted to the desired film thickness.

* * * * *